(12) United States Patent
Kim et al.

(10) Patent No.: US 7,459,399 B2
(45) Date of Patent: Dec. 2, 2008

(54) METHOD FOR MANUFACTURING PROBE STRUCTURE OF PROBE CARD

(75) Inventors: Bong Hwan Kim, Seoul (KR); Jong Bok Kim, Goyang-si (KR)

(73) Assignee: Unitest. Inc., (KR)

( * ) Notice: Subject to any disclaimer, the term of this patent is extended or adjusted under 35 U.S.C. 154(b) by 59 days.

(21) Appl. No.: 11/756,686

(22) Filed: Jun. 1, 2007

(65) Prior Publication Data
US 2007/0293053 A1    Dec. 20, 2007

(30) Foreign Application Priority Data
Jun. 16, 2006    (KR) .................. 10-2006-0054340

(51) Int. Cl.
*H01L 21/331*    (2006.01)
(52) U.S. Cl. ..................... 438/694; 438/719; 216/2

(58) Field of Classification Search ............ 438/52, 438/689, 694, 696, 719, 734–736; 216/2, 216/47; 324/762
See application file for complete search history.

(56) References Cited

U.S. PATENT DOCUMENTS 6,059,982 A * 5/2000 Palagonia et al. ............ 216/11
6,328,902 B1 * 12/2001 Hantschel et al. ............ 216/2

* cited by examiner

*Primary Examiner*—Tuan H Nguyen
(74) *Attorney, Agent, or Firm*—Sughrue Mion, PLLC

(57) ABSTRACT

A method for manufacturing a probe structure of a probe card is disclosed. In accordance with the method of the present invention, a dual etching process of a silicon substrate or an etching process of an SOI substrates is carried out using a sidewall insulating film pattern as an etching mask to facilitate a formation of a bump and microscopic probe structure of the probe card.

13 Claims, 7 Drawing Sheets

METHOD FOR MANUFACTURING PROBE STRUCTURE OF PROBE CARD

BACKGROUND OF THE INVENTION

1. Field of the Invention

The present invention relates to a method for manufacturing a probe structure of a probe card, and in particular to a method for manufacturing a probe structure of a probe card wherein a dual etching process of a silicon substrate or an etching process of an SOI substrates is carried out to facilitate a formation of a bump and microscopic probe structure of the probe card.

2. Description of the Related Art

A conventional probe structure used in a probe card is manufactured by etching a semiconductor substrate to form a probe tip region, and then using a photoresist film pattern defining a probe beam region.

While a patterning of a photoresist film pattern may be easily carried out in accordance with the method for manufacturing the probe structure, it is disadvantageous in that an MLC (multi-layer ceramic) should be used when forming a bonding bump.

SUMMARY OF THE INVENTION

It is an object of the present invention to provide a method for manufacturing a probe structure of a probe card wherein a dual etching process of a silicon substrate or an etching process of an SOI substrates is carried out to facilitate a formation of a bump and microscopic probe structure of the probe card.

In order to achieve above-described object of the present invention, there is provided a method for manufacturing a probe structure, the method comprising steps of: (a) forming a first mask layer pattern defining a probe beam region on a semiconductor substrate; (b) forming a second mask layer pattern defining a probe tip region on the semiconductor substrate and the first mask layer pattern; (c) etching the semiconductor substrate using the second mask layer pattern as an etching mask to form the probe tip region; (d) removing the second mask layer pattern; (e) etching the semiconductor substrate using the first mask layer pattern as the etching mask to form the probe beam region; (f) forming a sidewall insulating film pattern on a sidewall of each of the probe tip region and the probe beam region; (g) etching a predetermined thickness of a portion of the semiconductor substrate exposed by the first mask layer pattern; (h) removing the sidewall insulating film pattern and the first mask layer pattern; and (i) forming a probe tip and a probe beam in the probe tip region and the probe beam region.

It is preferable that the semiconductor substrate comprises an SOI substrate.

It is preferable that the step (c) comprises etching an oxide film of the SOI substrate until a silicon layer under the oxide film is exposed.

It is preferable that the step (e) comprises etching an oxide film of the SOI substrate until a silicon layer under the oxide film is exposed.

It is preferable that the step (h) further comprises removing an oxide film of the SOI substrate.

It is preferable that the first mask layer pattern and the second mask layer pattern comprise a CVD TEOS film, respectively.

It is preferable that the step (g) is carried out using a KOH solution and a TMAH solution.

It is preferable that the step (i) comprises an electroplating process.

It is preferable that the probe tip and the probe beam of the step (i) comprise a Ni—Co layer, respectively.

It is preferable that the step (i) comprises: forming a seed layer on the semiconductor substrate; forming a dummy mask layer pattern exposing the probe tip region and the probe beam region; and forming the probe tip and the probe beam in the probe tip region and the probe beam region, respectively.

It is preferable that the seed layer comprises a Ti/Cu layer.

It is preferable that after carrying out the step (i), further comprising: forming a photoresist film pattern exposing a region where a conductive bump is to be formed; forming the conductive bump in the region where the conductive bump is to be formed; and removing the photoresist film pattern.

It is preferable that the step (f) comprises: forming an insulating film on the portion of the semiconductor substrate exposed by the first mask layer pattern; and anisotropically etching the insulating layer until a surface of the semiconductor substrate is exposed to form the sidewall insulating film pattern on the sidewall of each of the probe tip region and the probe beam region.

DETAILED DESCRIPTION OF THE INVENTION

The present invention will now be described in detail with reference to the accompanied drawings. The interpretations of the terms and wordings used in Description and Claims should not be limited to common or literal meanings. The embodiments of the present invention are provided to describe the present invention more thoroughly for those skilled in the art.

Figure 1A:
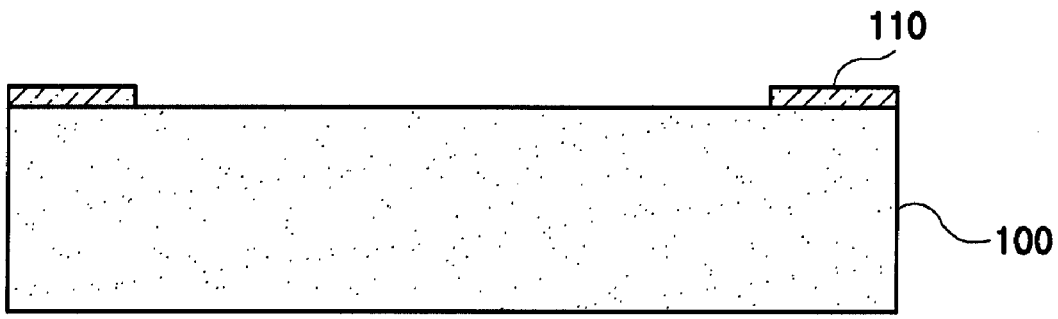
FIGS. 1a through 1n are cross-sectional views illustrating a method for manufacturing a probe structure of a probe card in accordance with a first preferred embodiment of the present invention.
Figure 1B:
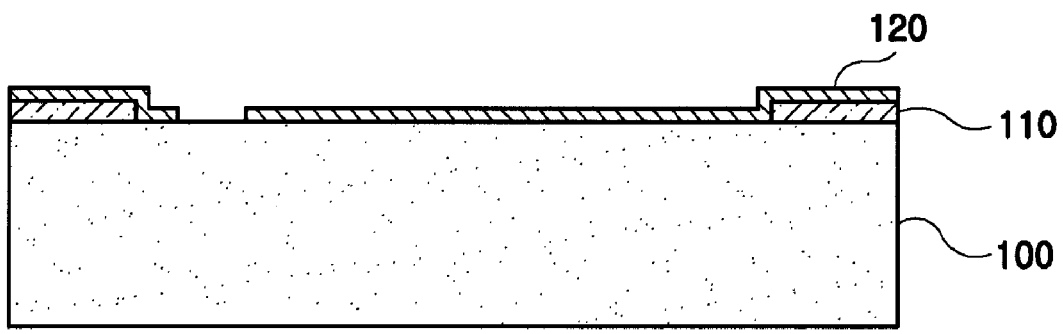
Figure 1C:
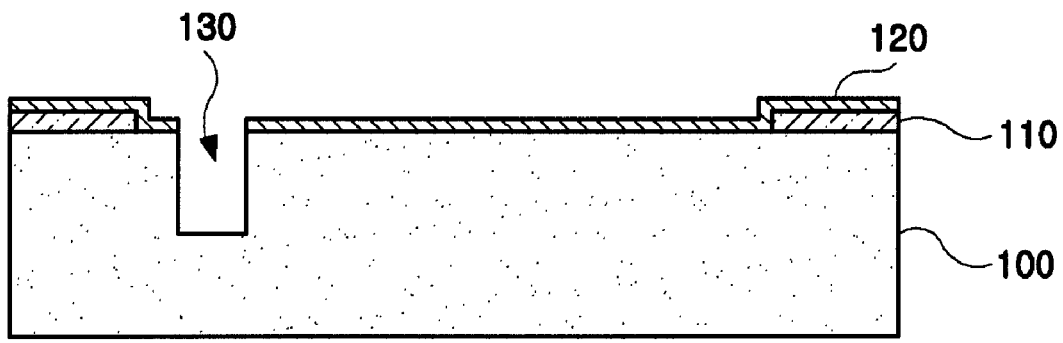
Figure 1D:
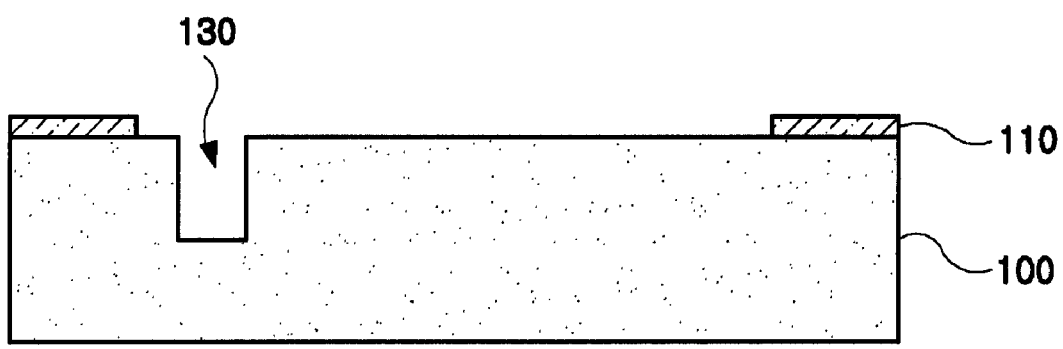
Figure 1E:
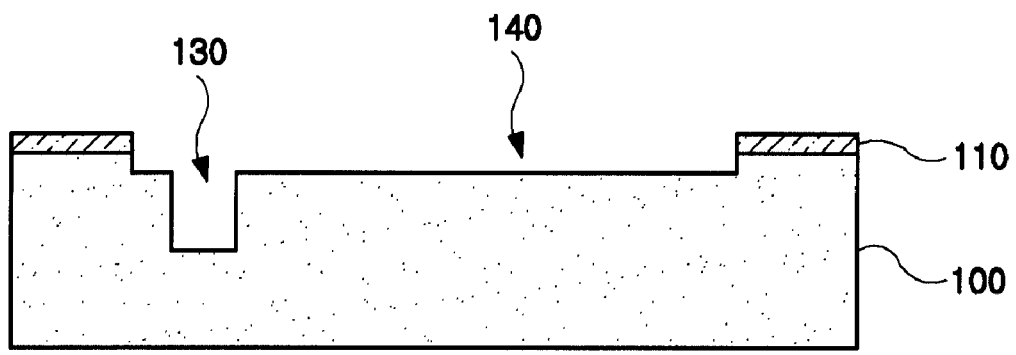
Figure 1F:
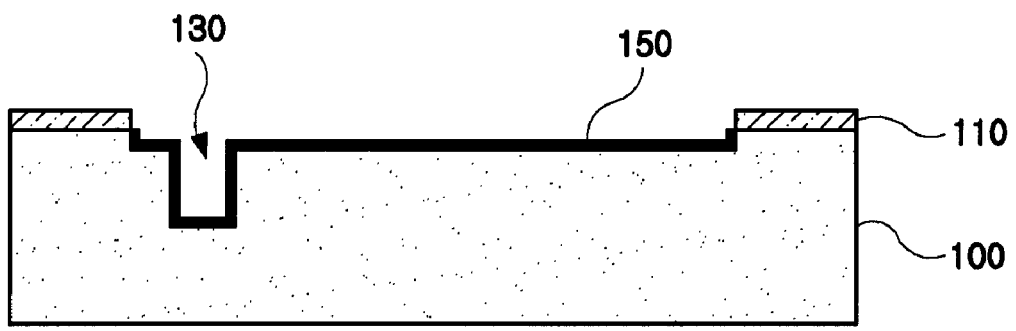
Figure 1G:
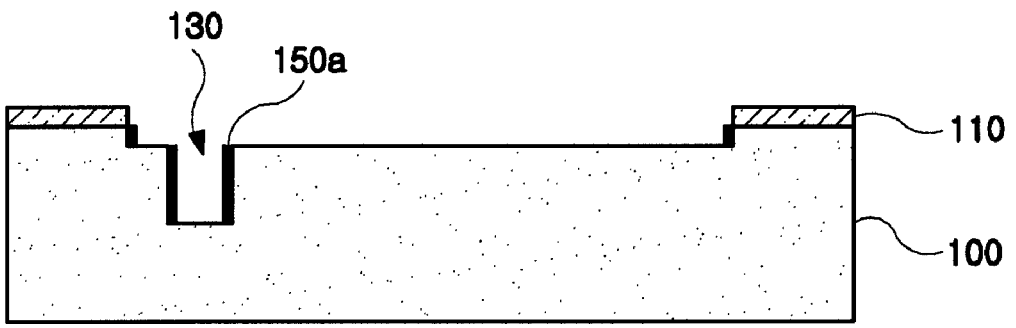
Figure 1H:
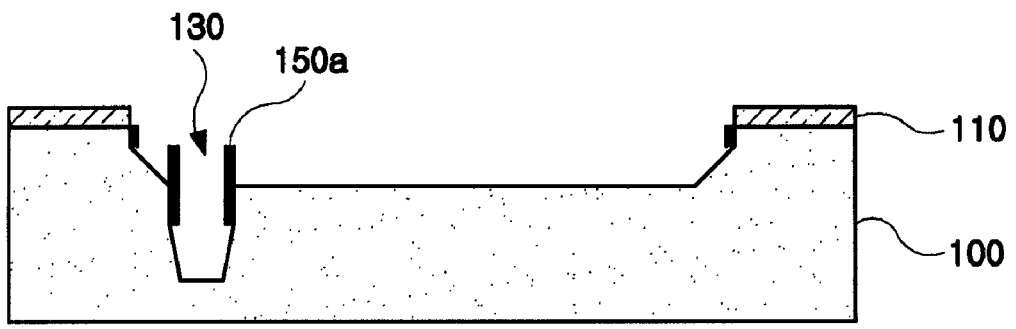
Figure 1I:
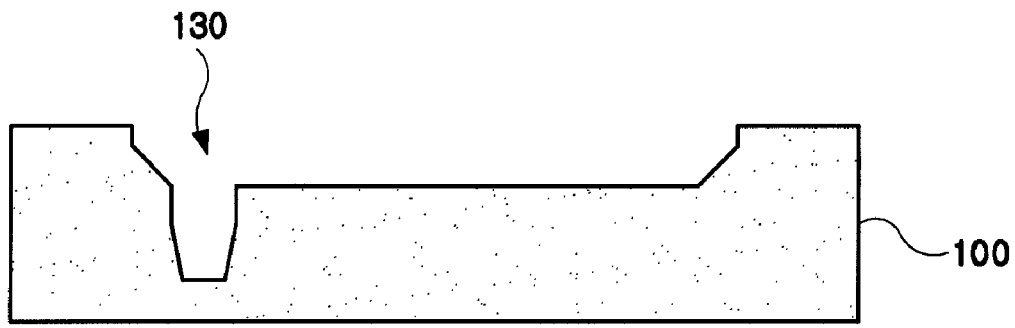
Figure 1J:
Figure 1K:
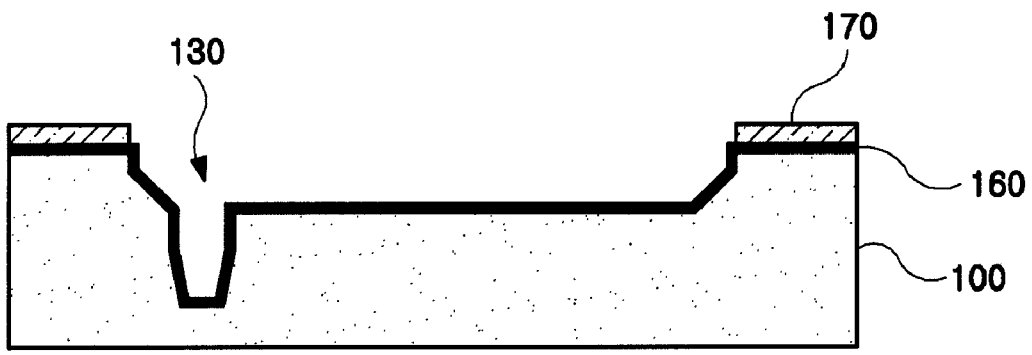
Figure 1L:
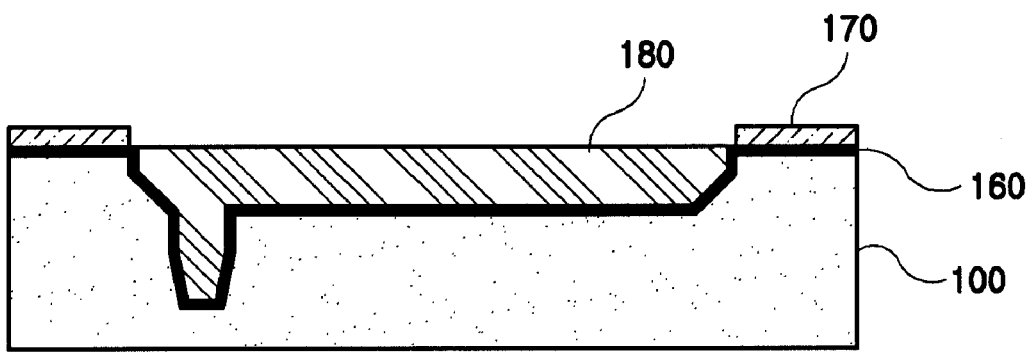
Figure 1M:
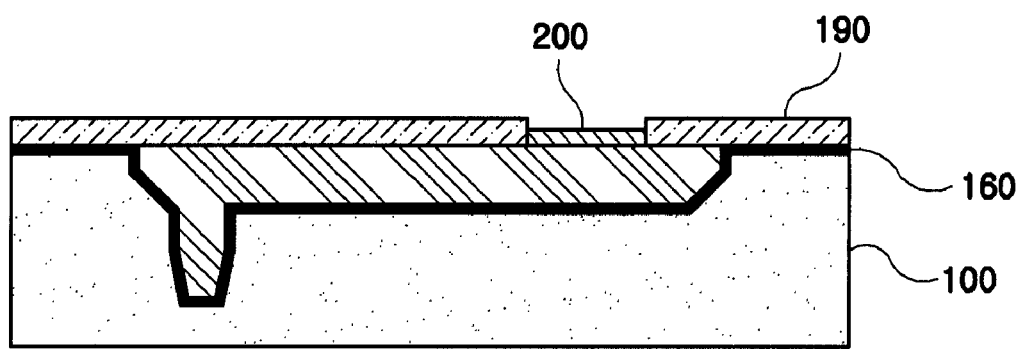
Figure 1N:
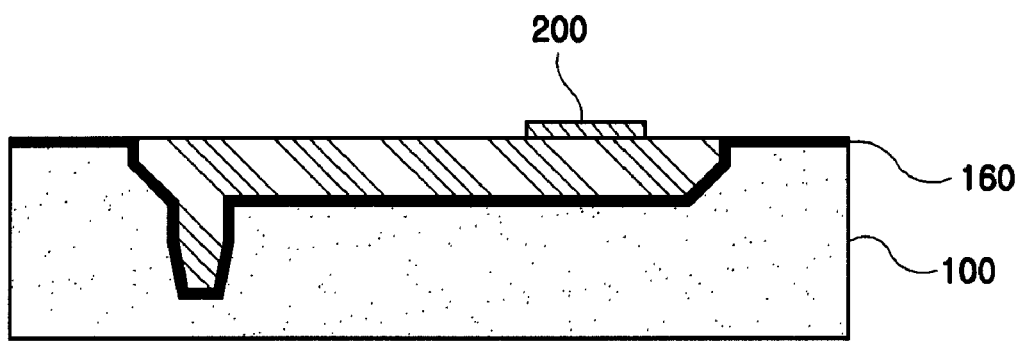

FIGS. 1a through 1n are cross-sectional views illustrating a method for manufacturing a probe structure of a probe card in accordance with a first preferred embodiment of the present invention.

Referring to FIG. 1a, a first mask layer pattern 110 defining a probe beam region 140 is formed on a semiconductor substrate 100. It is preferable that the first mask layer pattern 110 is formed by forming a TEOS film (not shown) on the semiconductor substrate 100 via a CVD (Chemical Vapor Deposition) process and then selectively etching the TEOS film.

Referring to FIG. 1b, a second mask layer pattern 120 defining a probe tip region 130 is formed on the semiconductor substrate 100 and the first mask layer pattern 110. Similar to the first mask layer pattern 110, it is preferable that the second mask layer pattern 120 is formed by forming the TEOS film (not shown) on the semiconductor substrate 100 via the CVD (Chemical Vapor Deposition) process and then selectively etching the TEOS film.

Referring to FIG. 1c, the semiconductor substrate 100 is etched using the second mask layer pattern 120 as an etching mask to form the probe tip region 130.

Referring to FIG. 1d, the second mask layer pattern 120 is removed to expose a region where a probe beam is to be formed.

Referring to FIG. 1e, the semiconductor substrate 100 is etched using the first mask layer pattern 110 as the etching mask to form the probe beam region 140.

Referring to FIG. 1f, an insulating film 150 is formed on a portion of the semiconductor substrate 100 exposed by the first mask layer pattern 110.

Referring to FIG. 1g, the insulating layer is anisotropically etched until a surface of the semiconductor substrate 100 is exposed to form a sidewall insulating film pattern 150a on a sidewall of each of the probe tip region 130 and the probe beam region 140.

Referring to FIG. 1h, a predetermined thickness of the portion of the semiconductor substrate 100 exposed by the first mask layer pattern 110 is etched.

Referring to FIG. 1i, the sidewall insulating film pattern 150a and the first mask layer pattern 110 are removed by en etching process. It is preferable that the etching process is carried out using a KOH solution and a TMAH (Tetramethylammonium hydroxide) solution.

Referring to FIG. 1j, a seed layer 160 is formed on the semiconductor substrate 100. It is preferable that the seed layer 160 comprises a Ti/Cu layer.

Referring to FIG. 1k, a dummy mask layer pattern 170 exposing the probe tip region 130 and the probe beam region 140 is formed.

Referring to FIG. 1l, a probe tip and a probe beam 180 are formed in the probe tip region 130 and the probe beam region 140, respectively. It is preferable that the probe tip and the probe beam 180 comprise a Ni—Co layer, respectively formed via an electroplating process.

Referring to FIG. 1m, a photoresist film pattern 190 exposing a region where a conductive bump 200 is to be formed, i.e. exposing an end portion of the probe beam 180 is formed. Thereafter, the conductive bump 200 is formed using a metal.

Referring to FIG. 1n, the photoresist film pattern 190 is removed to complete the formation of the probe structure.

Although not shown, the structure of FIG. 1n is bonded to a substrate having a cantilever support thereon using the conductive bump 200 as a medium, and the semiconductor substrate 100 is then removed to complete a manufacturing process of a probe card.

FIGS. 2a through 2m are cross-sectional views illustrating a method for manufacturing a probe structure of a probe card in accordance with a second preferred embodiment of the present invention.

Figure 2A:
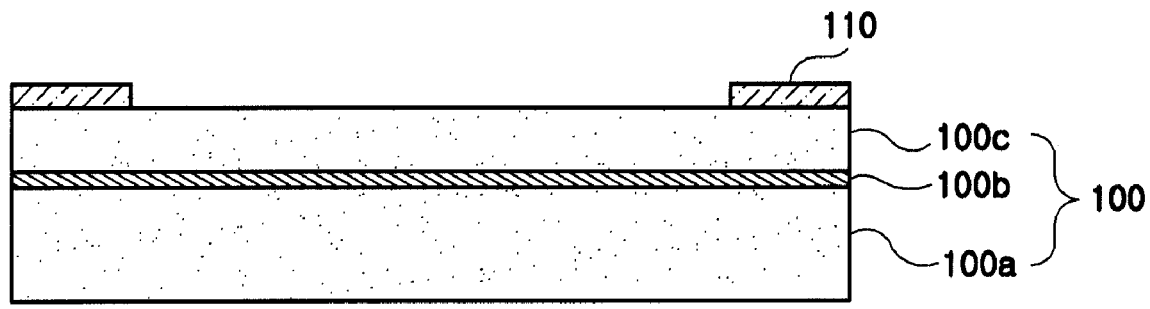
FIGS. 2a through 2m are cross-sectional views illustrating a method for manufacturing a probe structure of a probe card in accordance with a second preferred embodiment of the present invention.

Referring to FIG. 2a, a first mask layer pattern 110 defining a probe beam region 140 is formed on an SOI (Silicon-On-Insulator) substrate 100 including a first silicon layer 100a, an oxide film 100b and a second silicon layer 100c. It is preferable that the first mask layer pattern 110 is formed by forming a TEOS film (not shown) on the SOI substrate 100 via a CVD (Chemical Vapor Deposition) process and then selectively etching the TEOS film.

Figure 2B:
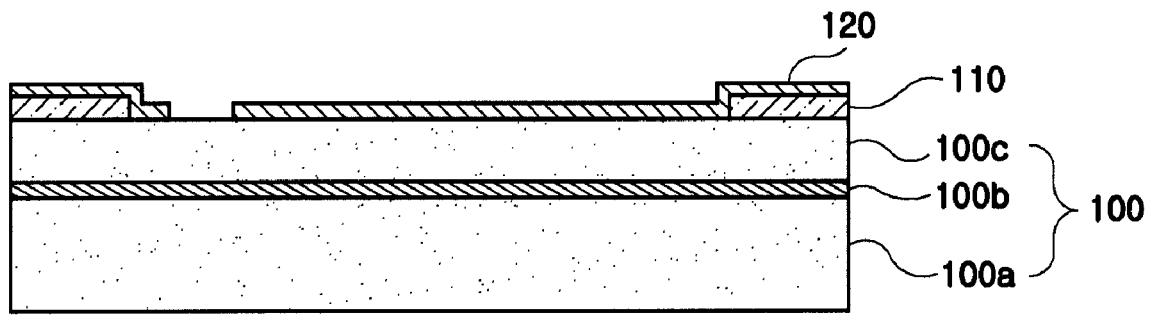

Referring to FIG. 2b, a second mask layer pattern 120 defining a probe tip region 130 is formed on the SOI substrate 100 and the first mask layer pattern 110. Similar to the first mask layer pattern 110, it is preferable that the second mask layer pattern 120 is formed by forming the TEOS film (not shown) on the SOI substrate 100 via the CVD (Chemical Vapor Deposition) process and then selectively etching the TEOS film.

Figure 2C:
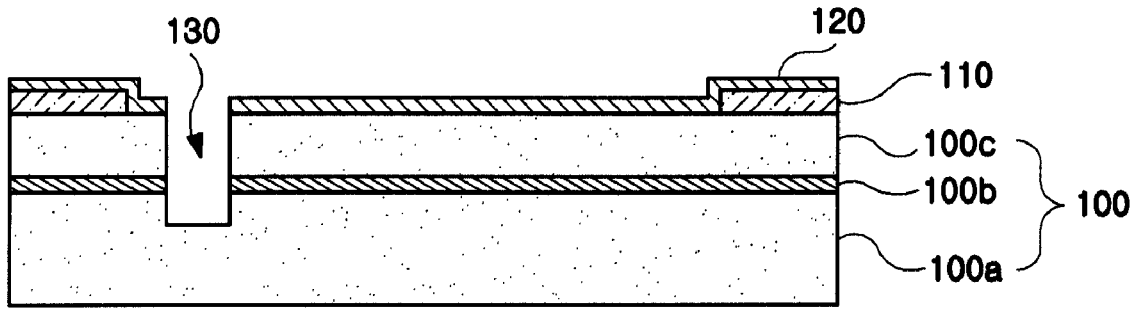

Referring to FIG. 2c, the SOI substrate 100 is etched using the second mask layer pattern 120 as an etching mask to form the probe tip region 130. It is preferable that the etching process is carried out until the first silicon layer 100a under the oxide film 100b is exposed.

Figure 2D:
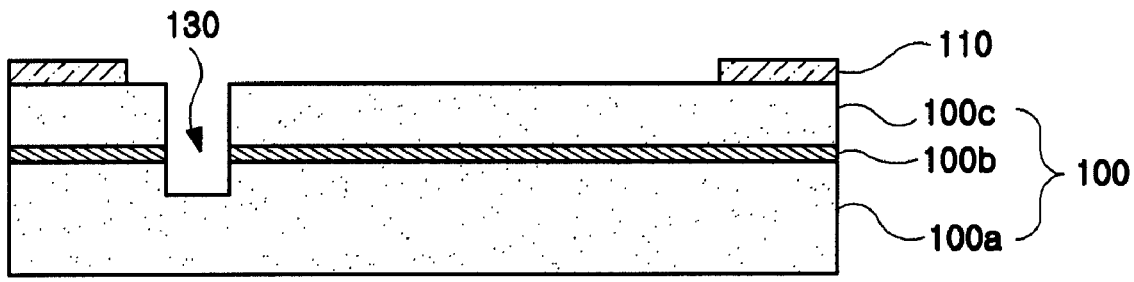

Referring to FIG. 2d, the second mask layer pattern 120 is removed to expose a region where a probe beam is to be formed.

Figure 2E:
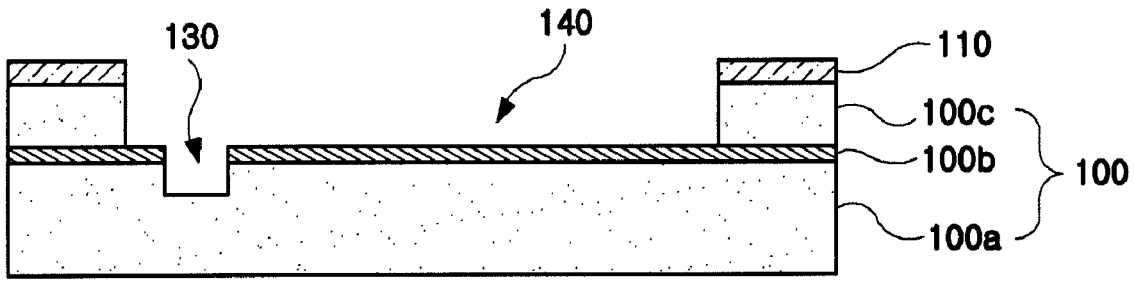

Referring to FIG. 2e, the SOI substrate 100 is etched using the first mask layer pattern 110 as the etching mask to form the probe beam region 140. It is preferable that the etching process is carried out until the oxide film 100b is exposed.

Figure 2F:
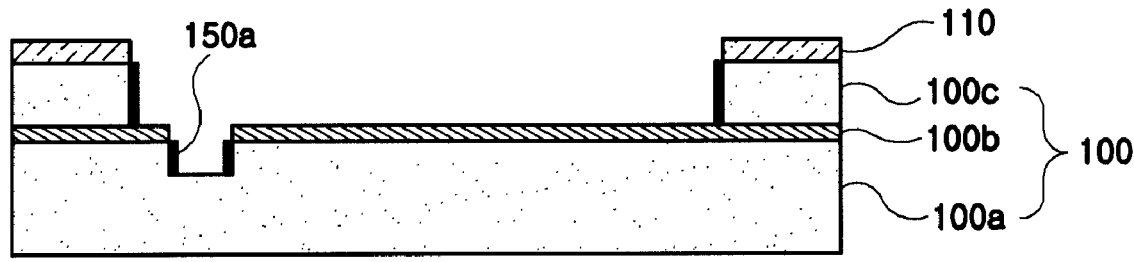

Referring to FIG. 2f, a sidewall insulating film pattern 150a is formed on a sidewall of each of the probe tip region 130 and the probe beam region 140.

Figure 2G:
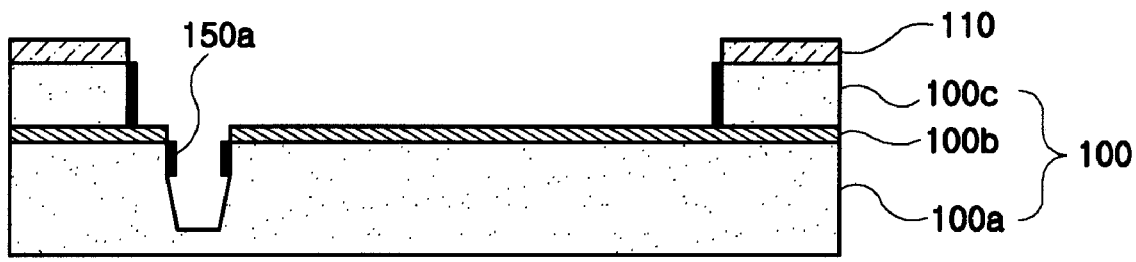

Referring to FIG. 2g, a predetermined thickness of the portion of the SOI substrate 100 exposed by the first mask layer pattern 110 is etched.

Figure 2H:

Referring to FIG. 2h, the sidewall insulating film pattern 150a and the first mask layer pattern 110 are removed by en etching process. It is preferable that the etching process is carried out using a KOH solution and a TMAH (Tetramethylammonium hydroxide) solution.

Figure 2I:
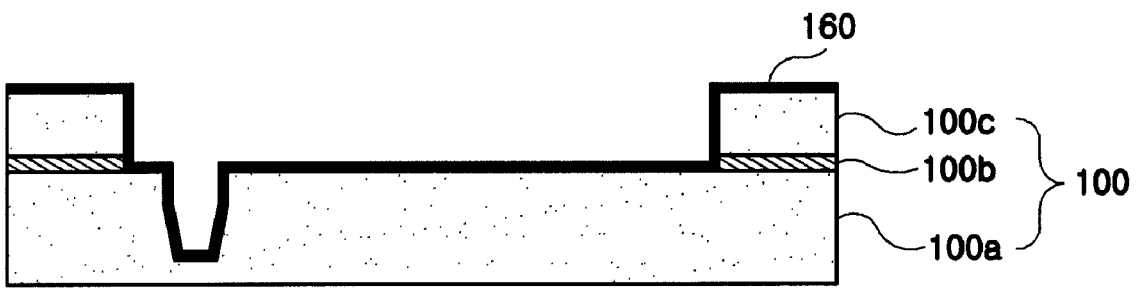

Referring to FIG. 2i, a seed layer 160 is formed on the SOI substrate 100. It is preferable that the seed layer 160 comprises a Ti/Cu layer.

Figure 2J:
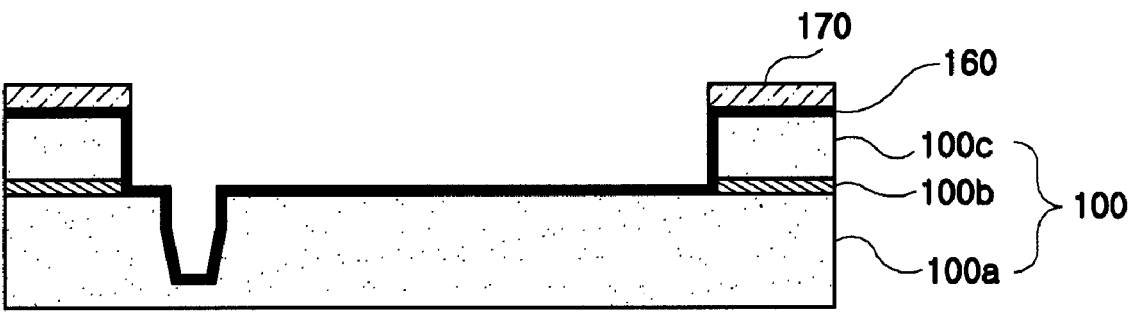

Referring to FIG. 2j, a dummy mask layer pattern 170 exposing the probe tip region 130 and the probe beam region 140 is formed.

Figure 2K:
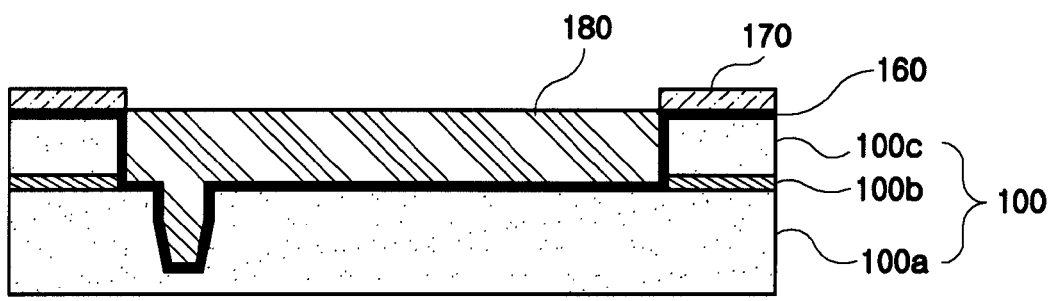

Referring to FIG. 2k, a probe tip and a probe beam 180 are formed in the probe tip region 130 and the probe beam region 140, respectively. It is preferable that the probe tip and the probe beam 180 comprise a Ni—Co layer, respectively formed via an electroplating process.

Figure 2L:
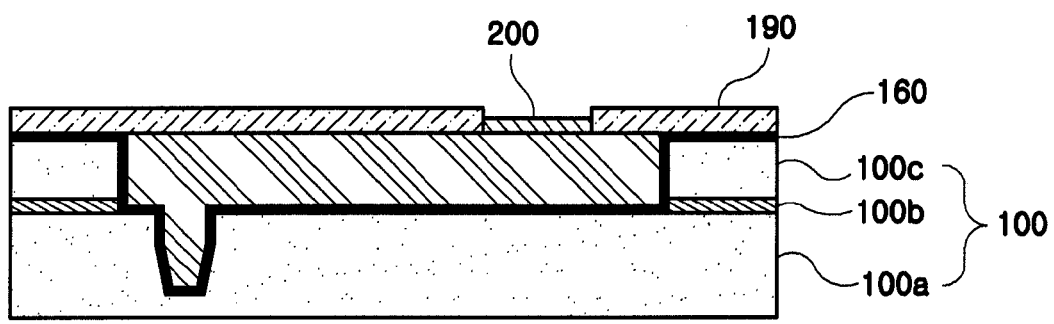

Referring to FIG. 2l, a photoresist film pattern 190 exposing a region where a conductive bump 200 is to be formed, i.e. exposing an end portion of the probe beam 180 is formed. Thereafter, the conductive bump 200 is formed using a metal.

Figure 2M:
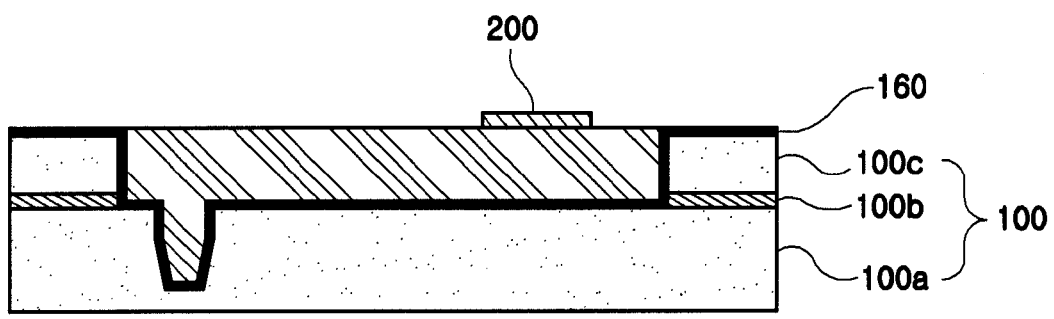

Referring to FIG. 2m, the photoresist film pattern 190 is removed to complete the formation of the probe structure.

Although not shown, the structure of FIG. 2m is bonded to a substrate having a cantilever support thereon using the conductive bump 200 as a medium, and the SOI substrate 100 is then removed to complete a manufacturing process of a probe card.

As described above, in accordance with the method for manufacturing the probe structure of the probe card of the present invention, the dual etching process of the silicon substrate or the etching process of the SOI substrates is carried out to facilitate a formation of a bump and microscopic probe structure of the probe card.

What is claimed is:

1. A method for manufacturing a probe structure, the method comprising steps of:
    (a) forming a first mask layer pattern defining a probe beam region on a semiconductor substrate;
    (b) forming a second mask layer pattern defining a probe tip region on the semiconductor substrate and the first mask layer pattern;
    (c) etching the semiconductor substrate using the second mask layer pattern as an etching mask to form the probe tip region;
    (d) removing the second mask layer pattern;
    (e) etching the semiconductor substrate using the first mask layer pattern as the etching mask to form the probe beam region;
    (f) forming a sidewall insulating film pattern on a sidewall of each of the probe tip region and the probe beam region;
    (g) etching a predetermined thickness of a portion of the semiconductor substrate exposed by the first mask layer pattern;

(h) removing the sidewall insulating film pattern and the first mask layer pattern; and (i) forming a probe tip and a probe beam in the probe tip region and the probe beam region.

2. The method in accordance with claim 1, wherein the semiconductor substrate comprises an SOI substrate.

3. The method in accordance with claim 2, wherein the step (c) comprises etching an oxide film of the SOI substrate until a silicon layer under the oxide film is exposed.

4. The method in accordance with claim 2, wherein the step (e) comprises etching an oxide film of the SOI substrate until a silicon layer under the oxide film is exposed.

5. The method in accordance with claim 2, wherein the step (h) further comprises removing an oxide film of the SOI substrate.

6. The method in accordance with claim 1, wherein the first mask layer pattern and the second mask layer pattern comprise a CVD TEOS film, respectively.

7. The method in accordance with claim 1, wherein the step (g) is carried out using a KOH solution and a TMAH solution.

8. The method in accordance with claim 1, wherein the step (i) comprises an electroplating process.

9. The method in accordance with claim 1, wherein the probe tip and the probe beam of the step (i) comprise a Ni—Co layer, respectively.

10. The method in accordance with claim 1, wherein the step (i) comprises:

forming a seed layer on the semiconductor substrate;

forming a dummy mask layer pattern exposing the probe tip region and the probe beam region; and forming the probe tip and the probe beam in the probe tip region and the probe beam region, respectively.

11. The method in accordance with claim 10, wherein the seed layer comprises a Ti/Cu layer.

12. The method in accordance with claim 1, after carrying out the step (i), further comprising:

forming a photoresist film pattern exposing a region where a conductive bump is to be formed;

forming the conductive bump in the region where the conductive bump is to be formed; and removing the photoresist film pattern.

13. The method in accordance with claim 1, wherein the step (f) comprises:

forming an insulating film on the portion of the semiconductor substrate exposed by the first mask layer pattern; and anisotropically etching the insulating layer until a surface of the semiconductor substrate is exposed to form the sidewall insulating film pattern on the sidewall of each of the probe tip region and the probe beam region.

* * * * *